United States Patent [19]

Celler et al.

[11] 4,240,843
[45] Dec. 23, 1980

[54] FORMING SELF-GUARDED P-N JUNCTIONS BY EPITAXIAL REGROWTH OF AMORPHOUS REGIONS USING SELECTIVE RADIATION ANNEALING

[75] Inventors: George K. Celler, Lawrenceville; Gabriel L. Miller, Westfield, both of N.J.

[73] Assignees: Western Electric Company, Inc., New York, N.Y.; Bell Telephone Laboratories, Incorporated, Murray Hill, N.J.

[21] Appl. No.: 908,792

[22] Filed: May 23, 1978

[51] Int. Cl.³ .................. H01L 21/263; H01L 21/26
[52] U.S. Cl. .................. 148/1.5; 148/187; 219/121 L; 357/13; 357/20; 357/91
[58] Field of Search .................. 148/1.5, 174, 187; 357/91, 13, 20; 219/121 L

[56] References Cited

U.S. PATENT DOCUMENTS

| 3,585,088 | 6/1971 | Schwuttke et al. | 148/174 |
| 3,589,949 | 6/1971 | Nelson | 148/1.5 |
| 3,771,026 | 11/1973 | Asai et al. | 317/234 R |
| 3,900,345 | 8/1975 | Lesk | 148/1.5 |
| 4,059,461 | 11/1977 | Fan et al. | 148/1.5 |
| 4,133,704 | 1/1979 | MacIver et al. | 148/1.5 |
| 4,154,625 | 5/1979 | Golovchenko et al. | 148/1.5 |
| 4,155,779 | 5/1979 | Auston et al. | 148/1.5 |

FOREIGN PATENT DOCUMENTS 0998386 7/1965 United Kingdom.

OTHER PUBLICATIONS

Campisano et al., "Laser Reordering ... Amorphous Layers ..." Solid St. Electronics, (Feb. 78) vol. 21, 485
Klimenko et al., "Laser ... Restoration ... Single Xfal" Sov. J. Quant. Electron. vol. 5 (1976) 1289
Csepregi et al., "Reordering ... Amorphous Layers ..." J. Appl. Phys. 48 (1977) 4234.
Vitali et al., "Surface ... Changes by Laser ..." Phys. Letts. 63A (1977) 351.
Csepregi et al., "... Recrystallization ... Si Layers ..." Phys. Letts. 54A (1975) 157.
Glowinski et al., "... Defects in Implanted ... Si ..." Appl. Phys. Letts. 28 (1976) 312.
Foti et al., "... Laser Annealing ... Si ..." Appl. Phys. 15 (1978, Apr.) 365.
Yasaitis, "Ion Impl." Planar Amorphous Isolaton.

*Primary Examiner*—L. Dewayne Rutledge
*Assistant Examiner*—Upendra Roy
*Attorney, Agent, or Firm*—Peter V. D. Wilde

[57] ABSTRACT

The specification describes structures, and methods for making them, in which self-guarded p-n junctions or the electrical isolation between multiple devices in an integrated circuit are formed using regions of amorphous semiconductor. The structures are conveniently formed by ion damaging the semiconductor to form the amorphous region and annealing selected portions of the amorphous region by selective radiation annealing.

5 Claims, 7 Drawing Figures

FORMING SELF-GUARDED P-N JUNCTIONS BY EPITAXIAL REGROWTH OF AMORPHOUS REGIONS USING SELECTIVE RADIATION ANNEALING

BACKGROUND OF THE INVENTION

To obtain effective reverse bias characteristics of a p-n junction it is known that edge or surface leakage of carriers through or across the material surrounding the periphery of the junction needs to be minimized. In a discrete device or integrated circuit the structural element serving this function is often termed a "guard ring." In planar devices the oxide layer covering the substrate minimizes surface leakage around the junction. Other structures designed for this purpose are mesas, p-n junction guard rings, and oxide regions penetrating below the surface of the semiconductor.

SUMMARY OF THE INVENTION

We have devised a new technique for making semiconductor devices. It utilizes regions of amorphous semiconductor to reduce unwanted current leakage. The amorphous region is formed using ion damage after which the active regions are defined by selective annealing.

DETAILED DESCRIPTION OF THE INVENTION

Figure 1:
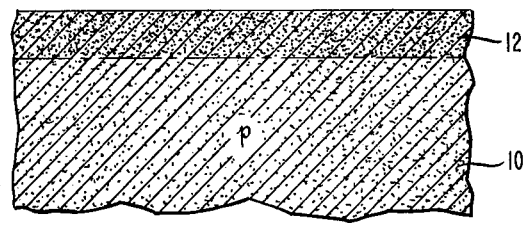
Figure 2:
Figure 2:
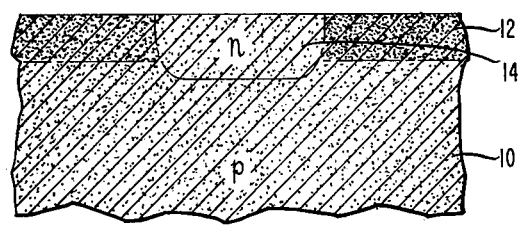
Figure 3:
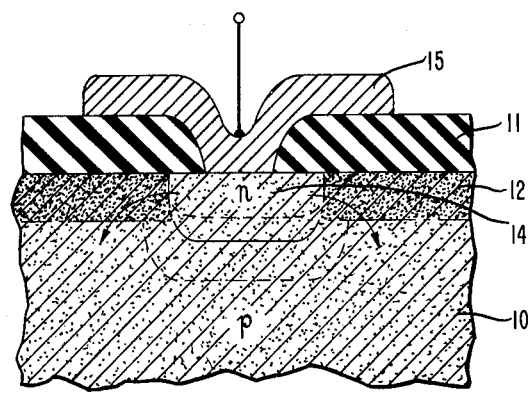

FIGS. 1-3 are schematic representations in section of a portion of a semiconductor device processed to give a self-guarded p-n junction according to one embodiment of the invention.

A typical sequence of processing steps that produce the desired structure is shown in FIGS. 1-3. In FIG. 1 the substrate 10, represents any semiconductor in which a p-n junction can be formed, but is preferably silicon or gallium arsenide. The substrate in this example is p-type but complementary structures are also possible. A region 12 of implanted n-type impurities is formed into the surface of the substrate. This implant can be made into a bare semiconductor substrate, through an insulator, or through a window made in the insulator according to well known practice. The implant is such as to render the silicon surface region either amorphous or to approach this condition.

The term amorphous refers to a well known and easily recognized state of matter, one which is essentially devoid of long range ordering, although some short range (e.g., nearest neighbor) ordering may be present. Semiconductor materials in this state are characterized by relative high resistivity that is adequate typically for the electrical function to which this invention is directed. For example, we have measured sheet resistivities in amorphous silicon of $10^9$ ohms per square in a surface layer approximately 1000 Angstroms thick obtained by ion implantation of single crystal material with a resistivity of approximately 1 ohm cm. Since the functional property that contributes to the effectiveness of this invention is primarily the sheet resistance of the amorphous region it would be sufficient to define an amorphous material that would function according to the invention as one having a resistivity within an order of magnitude of its intrinsic value.

The structure is then exposed to a source of high intensity radiation as shown in FIG. 2. The radiation is arranged to be incident on a portion of the substrate smaller than the implanted region, substantially as shown. The radiation source is a laser or electron beam having an energy, wavelength and exposure duration sufficient to couple enough power into the implanted region to melt the region to a depth at least equal to the depth of the implant. It has been shown by many workers in the art that the molten region will regrow epitaxially on the unmelted substrate to form a semiconductor with electrical properties comparable to those of the unimplanted semiconductor, O. G. Kutukova and L. N. Streltsov, "Laser Annealing of Implanted Silicon," Sov. Phys. Semicond. 10, 265 (1976); G. K. Celler, J. M. Poate and L. C. Kimerling, "Spatially Controlled Crystal Regrowth of Ion Implanted Silicon by Laser Irradiation," Appl. Phys. Lett. 32 (April 15, 1978); W. L. Brown et al., "Laser Annealing of Ion-Implanted Semiconductors," in proceedings of a Conference on Rapid Solidification Processing, Nov. 13-16, 1977, Reston, Virginia. It is evident that the melting step must take place in a brief time period if regrowth is to occur in a well defined region as suggested by FIG. 2. It is known that both laser and electron beam radiation are capable of creating a molten region with a molten lifetime of less than 5 $\mu$s. This is believed adequate for the purposes of this invention.

A typical device made with a self-guarded p-n junction formed as described is shown in FIG. 3. The device is a p-n junction diode shown schematically in a reverse bias condition. Electrode contact 15 is made through a window formed in an insulating layer 11, to which a positive bias is applied. The depletion region is also shown schematically. The potential leakage path across the junction is denoted by the arrows. We have found that although the material of layer 12 is silicon, it functions effectively to prevent excessive leakage. We have also made an effective p-n junction device through a very simple sequence of processing steps.

To demonstrate the effectiveness of this technique, and of the amorphous semiconductor guard ring, the following procedure was followed. A bare p-type <111> substrate, doped with boron to a resistivity of approximately 0.5 ohm cm was implanted with singly charged arsenic ions with sequential implants at energies of 16, 28, 46, 80 keV, with integrated beam current, of 44, 61, 95, 200 $\mu$c respectively, to give a total particle dose of $2.5 \times 10^{15}$ Arsenic ions/cm$^2$. The resulting implanted layer extended approximately 500 Angstroms into the silicon substrate with a dopant concentration of approximately $5 \times 10^{20}$ arsenic atoms/cm$^3$. A portion of the implanted layer was then exposed to a beam from a Nd:YAG laser having a spot size of approximately 40 microns between the (1/e) power-points. Approximately 25$\times$25 mil squares were exposed to the beam as it was pulsed stepwise across the area using an 80 percent overlap. Pulse power was varied on different samples from 40 to 120 MW/cm$^2$ and pulse duration was 150 nS$_2$. Resulting energy densities varied from 6 to 16.5 J/cm.

Figure 4:
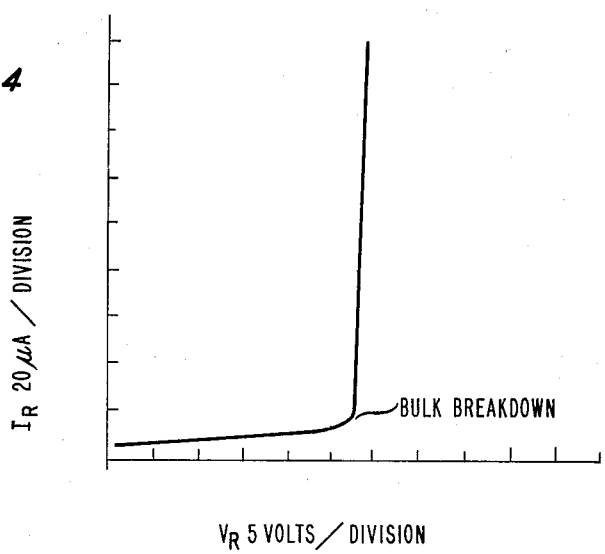

The reverse bias characteristic of a diode made according to this procedure at a pulse level of approximately 100 MW/cm$^2$ is shown in FIG. 4. The reverse bulk breakdown is adequate for many device applications. Forward bias characteristics were also adequate although departure from ideal leakage is evident at low currents ($10^{-7}$ amp).

It will be noted that the actual depth of the p-n junction shown in FIGS. 2 and 3 is greater than the depth of the implant. This is due to diffusion of the implanted impurities as the implanted region is annealed. Diffusion occurs even though the process is nearly instantaneous due to the high transport velocity of the impurities in liquid silicon and because the melting depth exceeds the implantation depth. The annealing can be accomplished alternatively in the solid phase by adjusting the laser parameters to be near the melting threshold but still below it. Solid state annealing with high quality epitaxial regrowth has also been demonstrated with silicon using an argon laser at power densities of the order of 10's of $MW/cm^2$ and spot dwell times of the order of a millisec. If an impurity region is annealed in the solid state it tends not to move substantially.

Figure 5:
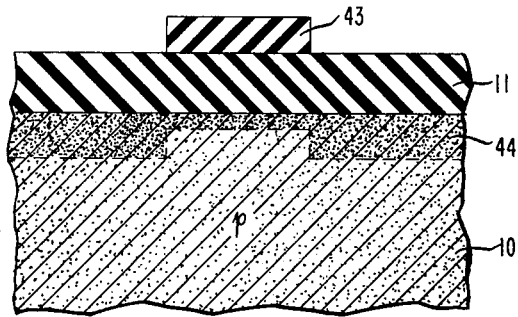
Figure 6:
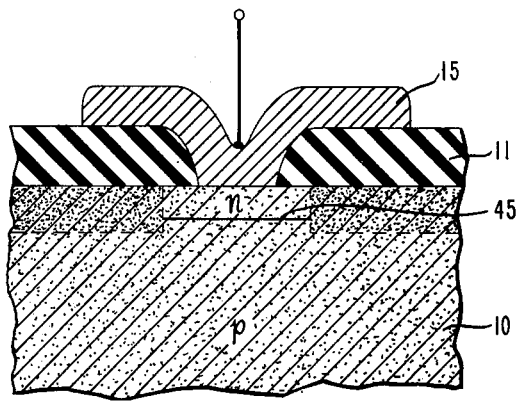

An alternative procedure that produces a planar junction is illustrated by FIGS. 5 and 6. The implant in this case is made through a mask 43 covering the region into which the junction is to be formed. The resulting implanted layer 44 is shallower in that region. The p-n junction 45 in the device resulting after annealing is planar as shown. Laser annealing can be effected directly on the masked structure because the mask material (e.g., $SiO_2$) will function to couple radiation selectively into the masked portion of the substrate due to the antireflection effect of the mask. The thickness of the mask can be adjusted to a multiple of $\theta$ wavelength to optimize the effect.

It will be appreciated that the Figures illustrate alternatively a discrete p-n junction device or a portion of an integrated circuit. The technique described by FIGS. 5 and 6 can be used to obtain isolation between devices. In that case the impurity region represented by the upper part of the p-n junction represents a tub into which devices such as diodes, and bipolar or field effect transistors can be formed. It can also be used for making CMOS and CBIC circuits. The vitalizing feature in each case is the formation of an electrically active p-n junction surrounded by an amorphous semiconductor or effectively isolated by an amorphous region in the case where the p-n junction exceeds the depth of the amorphous region (FIG. 3).

Figure 7:
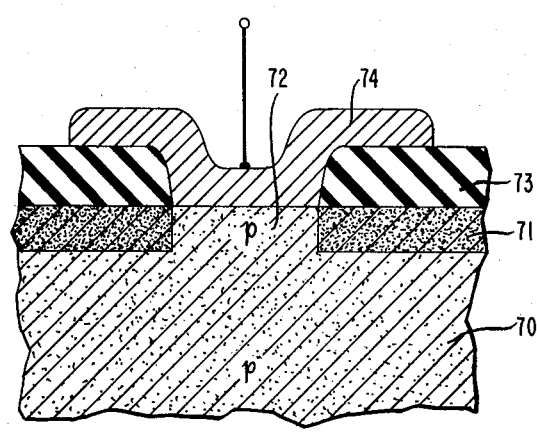

Another embodiment of the invention is shown in FIG. 7. In this case a low resistivity substrate 70 is implanted with a layer 71 of the same conductivity type. The active region 72 is annealed as described earlier either directly with a laser or alternatively, in this case, with a laser through the window in the insulating layer 73. The contact 74 can be an ohmic contact where the technique is used to form a substrate contact in an integrated circuit, or it can be a Schottky or MOS barrier contact, all of which are well known in the art.

An application of this embodiment that is particularly attractive is for isolation in MOS circuits. These devices function mainly by transfer of charge at or near the surface of the semiconductor chip and require therefore, for isolation, simply means for preventing surface inversion in the regions between active devices. In such cases the entire surface of the wafer being processed is converted to amorphous material and selected regions annealed as before. The selected regions in these cases would be typically, channel regions for insulated gate or junction field effect transistors, or charge transfer channels in the case of CCDs and BBDs. In the latter examples, the desired channel configurations can be created by scanning a continuous or pulsed laser or electron beam. A variety of ions may be used to create the amorphous layer, including both silicon or ions of the inert gases.

Various additional modifications and extensions of this invention will become apparent to those skilled in the art. All such variations and deviations which basically rely on the teachings through which this invention has advanced the art are properly considered to be within the spirit and scope of this invention.

We claim:

1. A method for making a semiconductor device comprising:

implanting ions of one conductivity type into the surface of a single crystal semiconductor substrate of the opposite conductivity type to form an ion implanted layer of essentially amorphous semiconductor overlying a substrate of essentially single crystal semiconductor, exposing a selected region of the amorphous ion implanted layer to laser radiation, the surface of said selected region being smaller than, and wholly within, the surface of the layer, the exposure to radiation being sufficient to regrow said selected region of the amorphous ion implanted layer epitaxially on the single crystal substrate thereby transforming the region to single crystal material, and forming a p-n junction with the periphery of the p-n junction in contact with the amorphous region.

2. A method for making a semiconductor device comprising:

implanting ions into the surface of a single crystal semiconductor substrate to form an ion implanted layer of essentially amorphous semiconductor material thus forming a layer of essentially amorphous semiconductor overlying a substrate of essentially single crystal semiconductor, exposing a selected region of the amorphous ion implanted layer to laser radiation, the surface of said selected region being smaller than, and wholly within, the surface of the layer, the exposure to radiation being sufficient to regrow said selected region of the amorphous ion implanted layer epitaxially on the single crystal substrate thereby transforming the region to single crystal material, and leaving a periphery of surrounding amorphous material.

3. The method of claim 1 in which the p-n junction is formed essentially planar throughout.

4. The method of claim 2 including the additional step of forming an electrical contact to the regrown single crystal region.

5. The method of claim 1 in which the step of implanting ions into the substrate forms an ion implanted layer having two thicknesses, with the selected region overlying the thinner part of the layer.

* * * * *